(12) United States Patent
Yue et al.

(10) Patent No.: US 7,701,248 B2
(45) Date of Patent: Apr. 20, 2010

(54) STORAGE ELEMENT FOR CONTROLLING A LOGIC CIRCUIT, AND A LOGIC DEVICE HAVING AN ARRAY OF SUCH STORAGE ELEMENTS

(75) Inventors: Kai Man Yue, Yuen Long N.T. (HK); Bomy Chen, Cupertino, CA (US); Geeng Chuan Michael Chern, Cupertino, CA (US); Tsung-Lu Syu, Fremont, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 15 days.

(21) Appl. No.: 12/100,406

(22) Filed: Apr. 10, 2008

(65) Prior Publication Data

US 2009/0256590 A1 Oct. 15, 2009

(51) Int. Cl.
*G06F 7/38* (2006.01)
*H03K 19/173* (2006.01)
*G11C 7/00* (2006.01)

(52) U.S. Cl. .................. 326/38; 365/185.33; 716/16
(58) Field of Classification Search ................. None
See application file for complete search history.

(56) References Cited

U.S. PATENT DOCUMENTS

| | | | |
|---|---|---|---|
| 5,260,610 A | 11/1993 | Pedersen et al. | |
| 5,260,611 A | 11/1993 | Cliff et al. | |
| 5,581,199 A | 12/1996 | Pierce et al. | |
| 5,594,363 A | 1/1997 | Freeman et al. | |
| 5,682,107 A | 10/1997 | Tavana et al. | |
| 5,847,993 A * | 12/1998 | Dejenfelt | 365/185.1 |
| 5,907,248 A | 5/1999 | Bauer et al. | |
| 5,914,616 A | 6/1999 | Young et al. | |
| 6,204,690 B1 | 3/2001 | Young et al. | |
| 6,356,478 B1 * | 3/2002 | McCollum | 365/185.01 |
| 6,448,808 B2 | 9/2002 | Young et al. | |
| 6,747,310 B2 * | 6/2004 | Fan et al. | 257/320 |
| 6,970,383 B1 | 11/2005 | Han et al. | |
| 7,221,186 B1 | 5/2007 | Young | |
| 7,430,137 B2 * | 9/2008 | Greene et al. | 365/185.05 |
| 2005/0185501 A1 * | 8/2005 | Lee et al. | 365/238.5 |
| 2006/0146596 A1 * | 7/2006 | Madurawe | 365/154 |
| 2008/0007291 A1 * | 1/2008 | McCollum et al. | 326/37 |

* cited by examiner

*Primary Examiner*—Vibol Tan
*Assistant Examiner*—Dylan White
(74) *Attorney, Agent, or Firm*—DLA Piper LLP (US)

(57) ABSTRACT

The present invention is a storage element for controlling a logic circuit and a logic device having a plurality of storage elements. The storage element has a first and a second non-volatile memory cells connected in series at an output node. Each of the first and second non-volatile memory cells is for storing a state opposite to the other. A demultiplexer has an input, a switched input and two outputs. The output node is connected to the input of the demultiplexer. One of the outputs is used to control the logic circuit. The other output is connected to a bit line which is connected to a sense amplifier. Finally, the switched input receives a switch signal and outputs the signal from the output node to either the one output or the other output.

27 Claims, 4 Drawing Sheets

STORAGE ELEMENT FOR CONTROLLING A LOGIC CIRCUIT, AND A LOGIC DEVICE HAVING AN ARRAY OF SUCH STORAGE ELEMENTS

TECHNICAL FIELD

The present invention relates to a storage element for controlling a logic circuit and wherein the storage element can be electrically re-programmed. The present invention also relates to a logic device comprising an array of such storage elements to control an array of logic circuits.

BACKGROUND OF THE INVENTION

Integrated circuit designs and fabrication are well known in the art. More generally integrated circuits have been classified as one of two types: memory or logic (including processors). Memory circuits, such as volatile or non-volatile memories, store information. Logic circuits, such as AND gates, OR gates, NOR gates, NAND gates, inverters, XOR gates, XNOR gates, Multiplexers, processor, and look-up tables, process signals.

In certain applications, it is desired to combine memory circuits with logic circuits in a device. Thus, one type of device is a field programmable logic device, wherein connection of logic circuits may be altered based upon states stored in the associated memories. Typically, the memories are field programmable, i.e. the state of the memory can be programmed or erased, after the device has been manufactured (or is in the field). One class of memory is non-volatile memory, where the state of the memory is retained after the power supply is disconnected from the device.

Another potential application of a device having both memory circuits and logic circuits, wherein the states stored in the memory circuits is used to alter the connection of the logic circuits is where a manufacturer has designed a plurality of products all having the same basic design but with different specifications. Rather than manufacturing (and maintaining inventory of) the plurality of different devices, the manufacturer could design a basic device with different logic circuits that are activated depending upon the specification desired. In this manner inventory management is greatly improved.

The prior art discloses a non-volatile memory cell of the type having a floating gate for storage of charges. The memory cell has a first region and a spaced apart second region, with each region being of a first conductivity type with a channel region of the second conductivity type therebetween. The floating gate is spaced apart from a first portion of the channel region and is adjacent to the first region. A coupling gate is over the floating gate and is capacitively coupled to the floating gate. A control gate is adjacent to and spaced apart from the floating gate and the coupling gate. The control gate is spaced apart from another portion of the channel region and has a portion adjacent to the second region. An erase gate is over the first region and is spaced apart therefrom and spaced apart from the floating gate and the coupling gate. See U.S. Pat. No. 6,747,310, whose disclosure is incorporated by reference in its entirety.

In the prior art it is also known to use two non-volatile memory cells connected in series to form a storage element to control a logic circuit. See U.S. Pat. No. 6,356,478. However, the cells are not of the same type and further, it is believed that such storage element is difficult to program/erase and verify.

SUMMARY OF THE INVENTION

Accordingly, in the present invention, a storage cell for controlling a logic circuit, said storage cell has a first and a second non-volatile memory cells of the same type connected in series at a first node. The first non-volatile memory cell is for being programmed in a first conduction state and the second non-volatile memory cell is for being programmed in a conduction second state, opposite the first conduction state. A demultiplexer has an input, two outputs and a switch input. The input is connected to the first node. One of the two outputs is coupled to the logic circuit. Another of the outputs is coupled to a sense amplifier for sensing the state of the first or second non-volatile memory cells. The switch input receives a switch signal to connect the first node to the one output or to the another output.

DETAILED DESCRIPTION OF THE INVENTION

Figure 1:
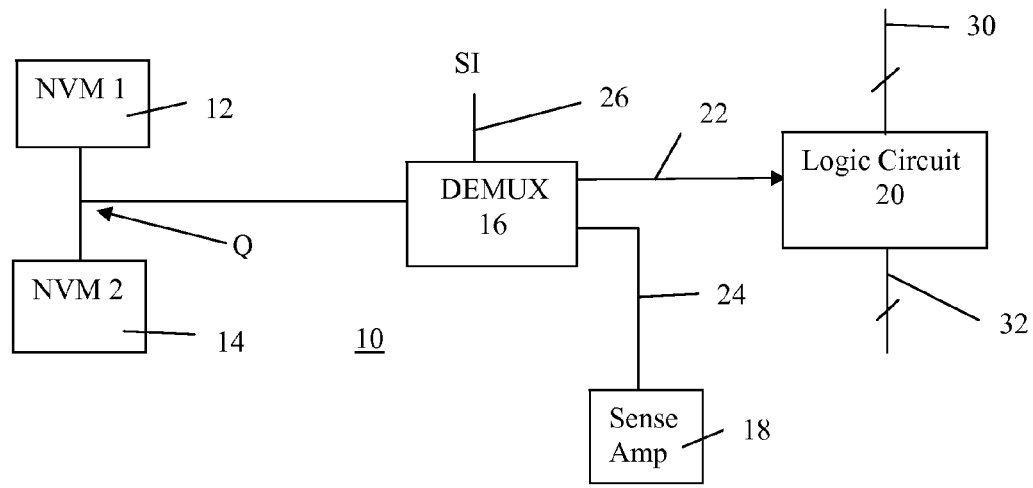
FIG. 1 is a block diagram of the storage element of the present invention.

Referring to FIG. 1 there is shown storage element 10 of the present invention for controlling a logic circuit 20. As previously discussed, the logic circuit 20 can be an AND gate, OR gate, NOR gate, NAND gate, inverter, XOR gate, XNOR gate, Multiplexer, or Look Up table or any other type of logic gate wherein a signal supplied on the input 30 thereto is operated upon by the logic circuit 20 to generate the output 32. The signal from the storage element 10 can be used to activate the logic circuit 20 to either cause the operation of the logic processing of the input signal on the input 30 to generate the output 32 or to perform other processing.

The storage element 10 comprises two non-volatile memory cells 12 and 14, of the same conductivity type, connected in series, with a node Q being at the connection between the non-volatile memory cell 12 and the non-volatile memory cell 14. Each of the non-volatile memory cells 12 and 14 is configured to store a state opposite to that of the other. Thus, for example, if the non-volatile memory cell 12 is programmed to store a state of "1", then the non-volatile memory 14 is programmed to store a state of "0". In that event, the node Q may have an output of "1". Conversely, if the non-volatile memory cell 12 is programmed to store a state of "0", then the non-volatile memory 14 is programmed to store a state of "1". In that event, the node Q may have an output of "0". The Q node is connected to the input of a demultiplexer 16. The demultiplexer 16 has one input (to which the Q node is connected) and two outputs (22 and 24), and a switched input 26. One of the outputs 22 is connected to the logic circuit 20 and is used to control the state of the logic circuit 20 as described above. The other output 24 is connected to a sense amplifier 18. Finally, the signal supplied on the switched input 26 is used to connect the signal on node Q to either the first output 22 or the second output 24. Thus, in one state of the switched input, the signal from node Q is supplied to the output 22. In another state of the switched input, the signal from node Q is supplied to the output 24.

The non-volatile memory cells 12 and 14 can be any of the well known types of non-volatile floating gate memory cells, SONOS memory cells, and phase changing memory cells. All of these memory cells are of the type where the state of conduction of the memory cell can be changed electrically, after they are manufactured (field programmable). Further, by non-volatile memory cells of the same conductivity type, it means that the cells 12 and 14 are of the same carrier conduction type, such as P or N. Since each non-volatile memory cells 12 and 14 must be programmed, and to ensure that they are programmed to the correct state, the output Q can be diverted to the output 24 or to a sense amplifier 18 by the signal on the switched input 26. Thus, the signal on the switched input 26 in one mode serves to cause the signal at node Q to be read by the sense amplifier 18 to ensure that it is programmed to the correct state. During "normal" operation of the storage element 10 where the signal on node Q is used to control the logic circuit 20, the switched input 26 is of course changed so that the node Q is supplied to the output 22 and to the logic circuit 20. as will be seen, while the switched input 26 can be a single signal to switch the connection from node Q to output 22 or output 24, in the preferred embodiment, two switched input signals are used to ensure that the node Q is connected to either the output 22 or the output 24.

Figure 2:
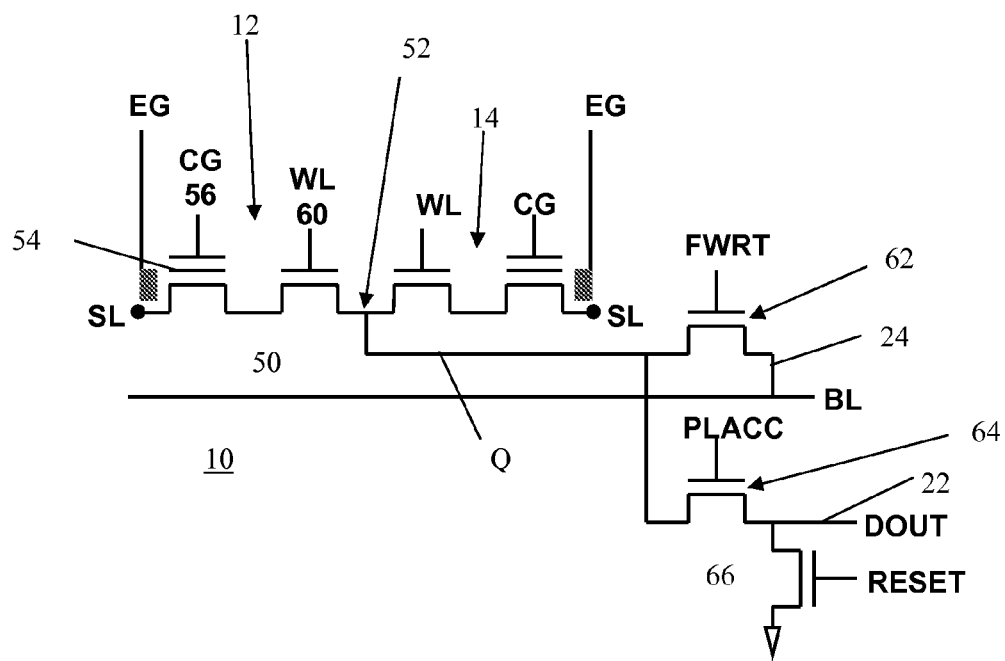
FIG. 2 is circuit diagram of one embodiment of the storage element shown in FIG. 1.

Referring to FIG. 2 there is shown in greater detail a preferred embodiment of the circuit diagram of the storage element 10 shown in FIG. 1. In the preferred embodiment, each of the non-volatile memory cells 12 and 14 is of the type which has a floating gate 54 for storage of charges. The cell 12 or 14 has a first region SL and a spaced apart second region 52, with each region being of a first conductivity type (such as P) with a channel region of the second conductivity type (such as N) therebetween. The floating gate 54 is spaced apart from a first portion of the channel region and is adjacent to the first region SL. A coupling gate 56 is over the floating gate 54 and is capacitively coupled thereto. A control gate 60 is adjacent to and spaced apart from the floating gate 54 and the coupling gate 56. The control gate 60 is spaced apart from another portion of the channel region and has a portion adjacent to the second region 52. An erase gate EG is over the first region SL and is spaced apart therefrom and is spaced apart from the floating gate 54 and the coupling gate 56. The two non-volatile memory cells 12 and 14 are connected with the second region 52 in common and providing the output Q. Each of the non-volatile memory cells 12 and 14 is of the type described in U.S. Pat. No. 6,747,310, whose disclosure is incorporated herein by reference in its entirety. In the preferred embodiment, each of the non-volatile memory cells 12 and 14 is of an N type cell, i.e. the channel region for the memory cell 12 and the memory cell 14 is of P type.

The Q output from the non-volatile memory cells 12 and 14 are supplied to a first N type transistor 62. A first signal FWRT is supplied to the gate of the first transistor 62, and depending on the FWRT signal, the first transistor 62 is either turned on or is turned off. The other end of the first transistor 62 is connected to the output 24 which is supplied to a bit line which is connected to a sense amplifier 18. The Q output is also supplied to a second N type transistor 64. The gate of the second transistor 64 is supplied with the signal PLACC. The signal PLACC controls whether the second transistor 64 is turned on or is turned off. The output of the second transistor 64 is connected to the output 22 which is connected to the logic circuit 20. A third N type transistor 66 is also connected to the output 22 to ground. Depending upon the signal RESET which is supplied to the gate of the third transistor 66, the third transistor 66 can connect the output 22 to ground.

In the operation of the storage element 10, initially the EG to the non-volatile memory cells 12 and 14 are supplied with a high voltage to cause the floating gates 54a and 56b of the non-volatile memory cells 12 and 14, respectively to be erased. Thereafter, one of the non-volatile memory cells 12 and 14 is programmed. As discussed heretofore, the non-volatile memory cells 12 and 14 are programmed to opposite states. Since both non-volatile memory cells 12 and 14 are erased, only one of the non-volatile memory cells 12 or 14 needs to be programmed to the programmed state. In addition, the RESET signal is held high to connect the output 22 to ground.

Assume that the non-volatile memory cell 14 is to be programmed. In that event, as is well known (and depending upon the process node geometry), a low voltage, such as ground or +0.5 volts is supplied on the bit line 24. A high FWRT signal is supplied to the first transistor 62 turning it on, thereby causing the low voltage on the bit line 24 to be supplied to the Q node 52. Voltage, on the order of +2.0 volts is supplied to the WL 60b of memory cell 14 causing the portion of the channel region beneath the WL 60b to be turned on. A high voltage, on the order of +5 volts is supplied to the first region SL of the memory cell 14. Finally, a high voltage on the order of +10 volts is supplied to the CG 56b of the memory cell 14. These voltages cause electrons to be attracted from the second region 52 to traverse the channel region of the memory cell 14 and attracted to the first region SL of the memory cell 14. When the electrons near the junction of the floating gate 54b above the channel region, they experience an abrupt large voltage attraction (due to the high voltage applied to the CG 56b, which is capacitively coupled to the floating gate 54b) causing the electrons to be injected onto the floating gate 54b, thereby programming the memory cell 14. During this time, the voltage supplied by the signal PLACC is maintained low, thereby preventing the second transistor 64 to be turned on, isolating the Logic circuit 20 from the storage element 10. In addition, the RESET signal is high thereby connecting the output 22 to ground.

To read the state of the memory cells 12 and 14 of the storage element 10 to ensure that the memory cells 12 and 14 have been correctly programmed (or erased, as the case may be), the following voltages are applied. PLACC remains low thereby turning off the second transistor 64. FWRT is high turning on the first transistor 62. A low voltage, such as ground is applied to the first region SL of the memory cell 12 and first region SL of the memory cell 14. A low voltage on the order of +2.5 volts is applied on CG 56a of the memory cell 12 and CG 56b of the memory cell 14. To read memory cell 12, a low voltage such as +2.5 volts is supplied on the WL 60a of the memory cell 12. Another low voltage, such as ground is applied to WL 60b of the memory cell 14, to turn off the channel region in the memory cell 14. As a result, current flow at Q node will be as follows. In the event memory cell 12 is programmed, the channel region in the memory cell 12 is turned off. No current flows at Q node and thus node 24. In the event memory cell 12 is erased, then the channel region in the memory cell 12 is turned on. Current flows from the Q node and thus node 24. The current flow of these two different conditions can be detected by the sense amplifier 18 to determine the state of memory cell 12. To read memory cell 14, a low voltage such as +2.5 volts is supplied on the WL 60b of the memory cell 14. Another low voltage, such as ground is applied to WL 60a of the memory cell 12, to turn off the channel region in the memory cell 12. In the event memory cell 14 is programmed, the channel region in the memory cell 14 is turned off. No current flows at Q node and thus node 24. In the event memory cell 14 is erased, then the channel region in the memory cell 14 is turned on. Current flows from the Q node and thus node 24. The current flow of these two different conditions can be detected by the sense amplifier 18 to determine the state of memory cell 12. During the read operation, the RESET signal is again held high, grounding the output 22.

Once the storage element 10 is programmed, then the following voltages are applied during "normal" operation. A low voltage, on the order of +2 volts is applied to the CG 56a and WL 60a of memory cell 12 and CG 56b and WL 60b of memory cell 14. A low voltage, such a ground is applied to the first region SL of the memory cell 12. A high voltage on the order of +1.2 volts is applied to the first region SL of the memory cell 14. The FWRT signal is brought low thereby turning off the first transistor 62. The RESET signal is held low thereby preventing the third transistor 66 from being turned on. The PLACC signal is brought high turning on the second transistor 64, so that the signal and voltage at node Q is passed to the output 22 and supplied to the logic circuit 20. In the event the memory cell 12 is programmed and memory cell 14 is erased, the Q node is connected to +1.2 volts. In the event the memory cell 12 is erased and the memory cell 14 is programmed, the Q node is connected to ground.

Figure 3:
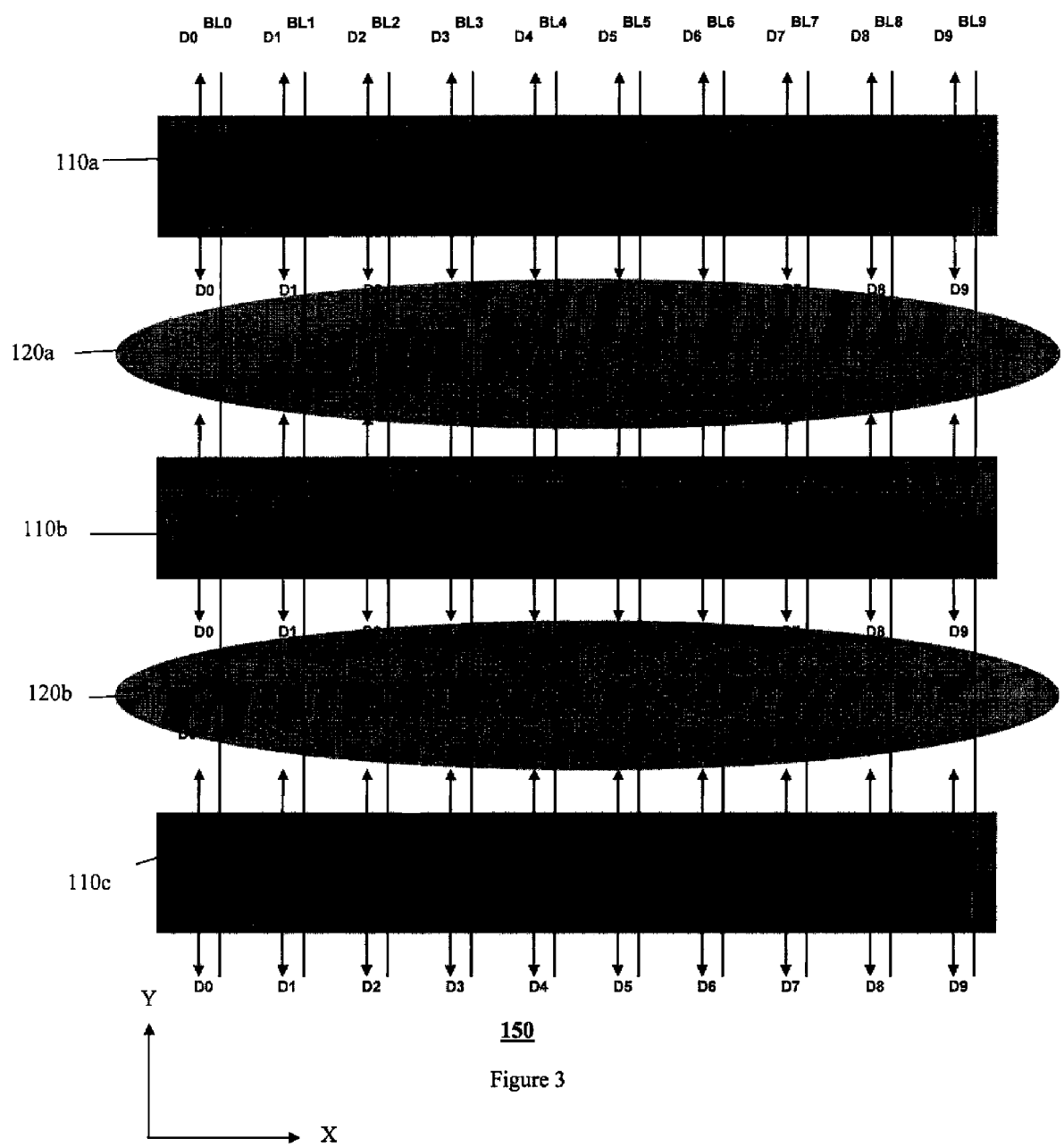
FIG. 3 is a plan view of an embodiment of a logic device having a plurality of arrays of storage elements of the present invention for controlling a plurality of arrays of logic elements.

Referring to FIG. 3 there is shown a plan view of an embodiment of a logic device 150 having a plurality of arrays (110a-110c) of storage elements of the present invention for controlling a plurality of arrays (120a-120b) of logic elements. Each array of storage elements, such as array 110a, comprises two rows of storage elements 10 and a plurality of columns. The storage elements 10 in the row direction are arranged in the X direction and the storage elements in the column direction are arranged in the Y direction, as shown in FIG. 3. As is well known in the art, the term rows and columns are interchangeable. The X direction is substantially perpendicular to the Y direction. Between the array 110a of storage elements 10 and the array 110b of storage elements 10 is an array of logic elements 120a. The array 120a of logic elements 20 also comprises at least one row (in the X direction) and a plurality of columns (in the Y direction). A logic element 20 in the array 120a is aligned with a storage element 10 in the array 110a (and with another storage element 10 in the array 110b). The input of the logic element 20 is electrically connected to the output 22 of the corresponding storage element 10. Also as shown in FIG. 3, a bit line 24 from one storage element 10 in one of the arrays, e.g. 110a connects to the corresponding storage element 10 in the same column in another array, e.g. 110b, crossing over the array 120a of logic elements 20 positioned between the two arrays 110a and 110b.

Figure 4:
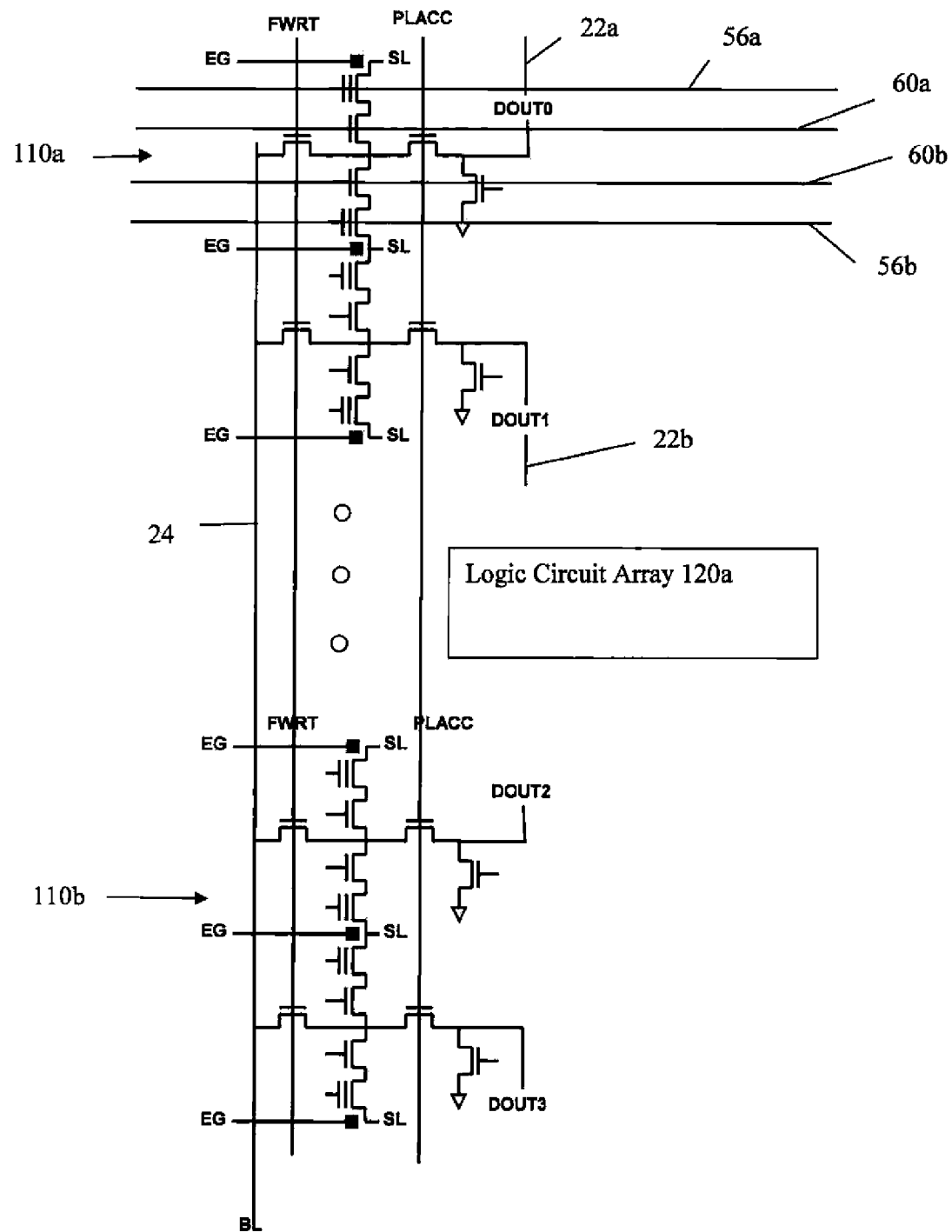
FIG. 4 is a detailed circuit diagram of a portion of the array of storage elements shown in FIG. 3.

Referring to FIG. 4 there is shown in greater detail a preferred embodiment of a portion of the logic device 150 of the present invention. As discussed for FIG. 3, the logic device 150 has a first array 110a of storage elements 10, and a spaced apart second array 100b of storage elements 10. Between the first array 110a and the second array 110b is an array 120a of logic circuits 20. In the first array 110a of storage elements 10 are two rows of storage elements 10, adjacent to one another. Thus, within each column there are two storage elements 10. the storage elements 10 are arranged such that the row lines 60a and 60b, run in the row direction, parallel to the control gates lines 56a and 56b. Further, an erase line connects to the erase gate of each storage element 10 and extends in the row direction. As previously discussed, the bit line 24 connects the arrays 110a and 110b of storage elements in the column direction. In addition, the signals FWRT and PLACC also connect to the arrays 110a and 110b in the column direction. Finally, the outputs, such as DOUT0 and DOUT1, from each of the storage elements 10, traverse in the column direction and are supplied to the logic circuit elements 20 in the logic circuit arrays 120 adjacent to the storage elements arrays 110.

Figure 5:
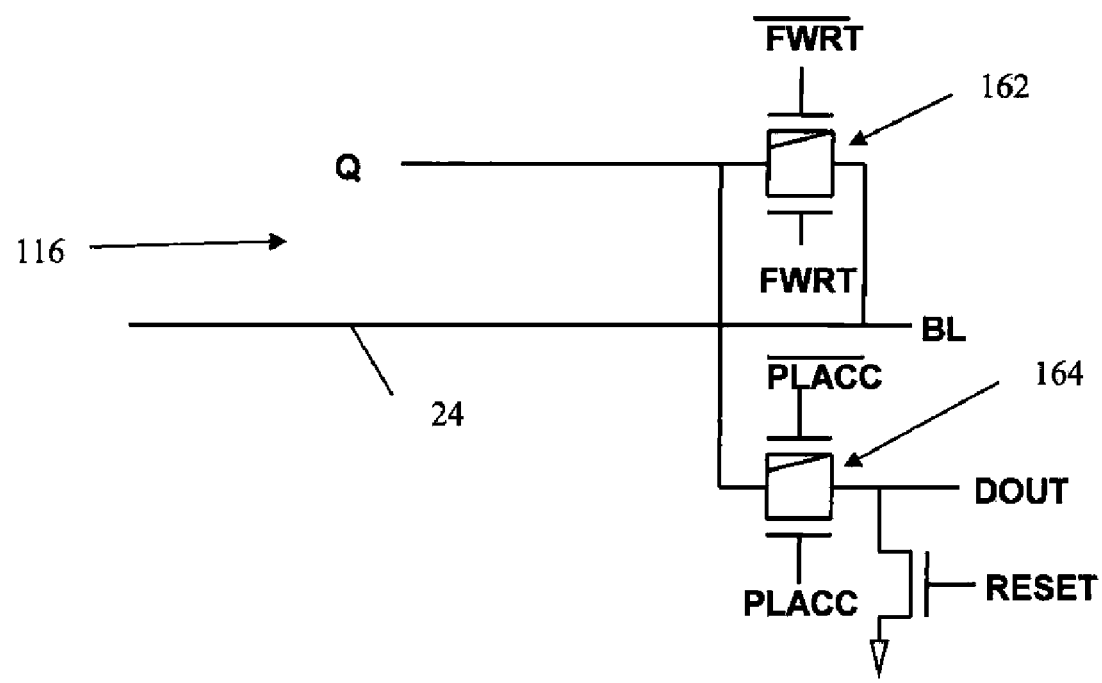
FIG. 5 is a detailed circuit diagram of another embodiment of a demultiplexer for use in the storage element of the present invention.

Referring to FIG. 5 there is shown a circuit diagram of another embodiment of the demultiplexer 16 for use in the storage element 10 of the present invention. The only difference between the demultiplexer 116 shown in FIG. 5 and the demultiplexer 16 shown in FIG. 2 is that the first transistor 62 is replaced by a first transmission gate 162, in which a N type transistor is connected in parallel to a P type transistor and the FWRT signal and its inverse are both supplied to the gates of the two transistors. Similarly, the second transistor 64 in the demultiplexer 16 is replaced by a second transmission gate 164 (having a P type transistor connected in parallel to a N type transistor) in which the signal PLACC and its inverse are supplied to the gates of the two transistors. The use of a transmission gate insures that the signal at the Q node is switched completely (or on) from the bit line 24 or from the output 22.

It should be clear from the foregoing that other variations of the invention are possible without deviating from the spirit of the invention.

What is claimed is:

1. A storage element for controlling a logic circuit, said storage element comprising:

a first floating gate flash memory transistor of a first conductivity type, said first floating gate flash memory transistor having a first region and a spaced apart second region, each region being of a second conductivity type with a channel region of the first conductivity type therebetween; a floating gate is spaced apart from a first portion of the channel region and is adjacent to the first region; a coupling gate is over the floating gate and is capacitively coupled thereto; a control gate is adjacent to and spaced apart from the floating gate and the coupling gate, said control gate is spaced apart from another portion of the channel region and has a portion adjacent to the second region; an erase gate is over the first region and is spaced apart therefrom and spaced apart from the floating gate and the coupling gate;

a second floating gate flash memory transistor of the first conductivity type, said second floating gate flash memory transistor has a first region and a spaced apart second region, each region being of the second conductivity type with a channel region of the first conductivity type therebetween; a floating gate is spaced apart from a first portion of the channel region and adjacent to the first region; a coupling gate is over the floating gate and is capacitively coupled thereto; a control gate is adjacent to and spaced apart from the floating gate and the coupling gate, said control gate is spaced apart from another portion of the channel region and has a portion adjacent to the second region; an erase gate is over the first region and is spaced apart therefrom and spaced apart from the floating gate and the coupling gate;

wherein the second region of the first floating gate flash memory transistor is electrically connected to the second region of the second floating gate flash memory transistor, and provides a storage output; and a switch having an input, two outputs, and a switch input for receiving the storage output at the input, and for supplying a signal to one of the two outputs in response to the switch input, wherein said one output being coupled to the logic circuit.

2. The storage element of claim 1 wherein the switch comprises two MOS transistors of the first conductivity type.

3. The storage element of claim 1 wherein the other output is connected to a sense amplifier.

4. The storage element of claim 1 wherein said first conductivity is N type.

5. The storage element of claim 1 wherein said first conductivity is P type.

6. A storage cell for controlling a logic circuit, said storage cell comprising:
   a first and a second non-volatile memory cells of the same type connected in series at a first node wherein said first non-volatile memory cell is for being programmed in a first conduction state and said second non-volatile memory cell is for being programmed in a conduction second state, opposite said first conduction state; and
   a switch having an input, two outputs and a switch input; said input connected to the first node; one of said two outputs coupled to the logic circuit; another of the outputs coupled to a sense amplifier for sensing the state of the first or second non-volatile memory cells; and the switch input for receiving a switch signal to connect the first node to the one output or to the another output.

7. The storage cell of claim 6 wherein each of the first and second non-volatile memory cells is a floating gate memory transistor.

8. The storage cell of claim 6 wherein each of the first and second non-volatile memory cells is a phase changing memory cell.

9. The storage cell of claim 6 wherein each of the first and second non-volatile memory cells is a SONOS memory cell.

10. The storage cell of claim 6 wherein said switch comprises two MOS transistors of the same conductivity type.

11. The storage cell of claim 10 wherein each of said MOS transistors of said switch are P type.

12. The storage cell of claim 6 wherein said switch comprises two transmission gates.

13. A programmable logic device comprising:
   a plurality of storage elements arranged in an array comprising at least one row and a plurality of columns;
   each storage element comprising a first and a second non-volatile memory cells of the same type connected in series at a first node wherein said first non-volatile memory cell is for being programmed in a first conduction state and said second non-volatile memory cell is for being programmed in a second conduction state, opposite said first conduction state;
   each storage element having an associated switch, each switch having an input, two outputs and a switch input; said input of a switch connected to the first node of an associated storage element; one of said two outputs coupled to a sense amplifier for sensing the state of the first or second non-volatile memory cells; and a switch input for receiving a switch signal to connect the first node to the one output or to another output;
   a plurality of logic elements arranged in an array comprising at least one row and a plurality of columns, with each logic element substantially aligned with a storage element in the column direction; and
   each logic element having an input coupled to the another output of the associated storage element.

14. The logic device of claim 13 wherein said input of each logic element is connected to the another output of the associated storage element in the column direction.

15. The logic device of claim 13 wherein each storage element comprises:
   a first floating gate flash memory transistor of a first conductivity type, said first floating gate flash memory transistor having a first region and a spaced apart second region, each region being of a second conductivity type with a channel region of the first conductivity type therebetween; a floating gate is spaced apart from a first portion of the channel region and adjacent to the first region; a coupling gate is over the floating gate and is capacitively coupled thereto; a control gate is adjacent to and spaced apart from the floating gate and the control gate, said control gate is spaced apart from another portion of the channel region and having a portion adjacent to the second region; an erase gate is over the first region and is spaced apart therefrom and spaced apart from the floating gate and the coupling gate;
   a second floating gate flash memory transistor of the first conductivity type, said second floating gate flash memory transistor having a first region and a spaced apart second region, each region being of the second conductivity type with a channel region of the first conductivity type therebetween; a floating gate is spaced apart from a first portion of the channel region and adjacent to the first region; a coupling gate is over the floating gate and is capacitively coupled thereto; a control gate is adjacent to and spaced apart from the floating gate and the control gate, said control gate is spaced apart from another portion of the channel region and having a portion adjacent to the second region; an erase gate is over the first region and is spaced apart therefrom and spaced apart from the floating gate and the coupling gate; and
   wherein the second region of the first floating gate flash memory transistor is electrically connected to the second region of the second floating gate flash memory transistor, and provides the first node.

16. The logic device of claim 15 wherein the switch comprises two MOS transistors of the first conductivity type.

17. The logic device of claim 15 wherein the other output is connected to a sense amplifier.

18. The logic device of claim 15 wherein the plurality of logic elements are AND circuits.

19. The logic device of claim 15 wherein the plurality of logic elements are OR circuits.

20. The logic device of claim 15 wherein the plurality of logic elements are Look Up Table circuits.

21. The logic device of claim 15 wherein the plurality of logic elements are switches.

22. The logic device of claim 15 wherein said plurality of storage elements include a plurality of spaced apart arrays of storage elements, each array having at least one row and a plurality columns of storage elements; and
   wherein said plurality of logic elements include a plurality of spaced apart arrays of logic elements, each array having at least one row and a plurality columns of logic elements; and
   wherein each array of logic elements is between each array of storage elements.

23. The logic device of claim 15 wherein said plurality of storage elements include a plurality of spaced apart arrays of storage elements, each array having at least one row and a plurality columns of storage elements; and
   wherein said plurality of logic elements include a plurality of spaced apart arrays of logic elements, each array having at least one row and a plurality columns of logic elements; and wherein each array of logic elements is between each array of storage elements.

24. The logic device of claim 23 further comprising a plurality of bit lines, each bit line crossing a plurality of arrays of storage elements and a plurality of arrays of logic elements and connecting to the one output of each storage element in a column direction, with the sense amplifier connected to each bit line.

25. The logic device of claim 23 further comprising a plurality of word lines, a first word line extending in the row direction connecting the coupling gate of said first floating gate flash memory transistors in the same row, a second word line extending in the row direction connecting the coupling gate of said second floating gate flash memory transistors in the same row; a third word line extending in the row direction connecting the control gate of said first floating gate flash memory transistors in the same row; and a fourth word line extending in the row direction connecting the control gate of said second floating gate flash memory transistors in the same row.

26. The logic device of claim 23 further comprising a plurality of erase lines, each extending in the row direction connecting the erase gate of said first and second floating gate flash memory transistor.

27. The logic device of claim 25, wherein a method of operation of the logic device comprises controlling the voltage applied to the first word line and the second word line to minimize the leakage current of the storage element.

* * * * *